United States Patent [19]

Matsumoto

[11] 4,454,810
[45] Jun. 19, 1984

[54] APPARATUS FOR LITHOGRAPHY OR INTAGLIO PRINTING

[75] Inventor: Katsutoshi Matsumoto, Kyoto, Japan

[73] Assignee: Dainippon Screen Mfg. Co., Ltd., Kyoto, Japan

[21] Appl. No.: 367,440

[22] Filed: Apr. 12, 1982

[30] Foreign Application Priority Data

Apr. 28, 1981 [JP] Japan .................................. 56-64717
Jun. 23, 1981 [JP] Japan .................................. 56-98004

[51] Int. Cl.³ .......................... B41F 5/00; B41F 7/00; B41F 31/18; B41L 27/20
[52] U.S. Cl. ..................................... 101/141; 101/153
[58] Field of Search ................... 101/415.1, 216, 219, 101/228, 232, 234, 235, 141, 245, 136, 151, 152, 153

[56] References Cited

U.S. PATENT DOCUMENTS 3,536,006 10/1970 Roozee .................. 101/415.1 X
3,949,864 4/1976 Montsant ................. 101/232 X
4,273,043 6/1981 Martino ................. 101/415.1 X

FOREIGN PATENT DOCUMENTS 929026 6/1973 Canada ........................... 101/415.1

Primary Examiner—Edgar S. Burr
Assistant Examiner—Moshe I. Cohen
Attorney, Agent, or Firm—Brumbaugh, Graves, Donohue & Raymond

[57] ABSTRACT

The embodiment of a lithography or intaglio printing apparatus described herein include a plate cylinder, an impression cylinder adapted to be periodically pressed against the plate cylinder for rotation therewith at the same speed as that of said plate cylinder, and inking rollers in contact with the surface of a plate. The length of a printing plate mounted on the plate cylinder is less than a half of the peripheral length of the plate cylinder and is also less than the peripheral distance between the contact points of inking rollers with the surface of the printing plate and of the objects to be printed with the surface of the printing plate. The impression cylinder is moved intermittently toward said printing plate to urge sheet material into contact therewith and the periods during which the inking rollers and the sheet material are maintained in contact with the printing plate may be changed independently.

3 Claims, 4 Drawing Figures

APPARATUS FOR LITHOGRAPHY OR INTAGLIO PRINTING

BACKGROUND OF THE INVENTION

The invention relates to an apparatus for lithography or intaglio printing, and more particularly to an apparatus suited to intaglio printing effected without aid of dampening water or a doctor blade.

There are many forms of apparatus and methods designed to directly print papers or other sheet materials by means of a printing plate which is not dampened with water. This printing plate is covered with an oil-repellent laminate some portions of which are eliminated to form a lipophilic image area, other portions of the laminate remaining to form an oil-repellent non-image area. The oil-repellent laminate is composed of a silicone rubber carried on an elastic sheet and having photosensitive chemical groups in its molecular structure. The above-mentioned partial elimination of the oil-repellent laminate is effected photographically by means of exposure to a light image and development by a developer solution. Such an intaglio printing plate is then mounted on a plate cylinder in order to print thick sheet materials such as metal or plastic sheets. The printed thickness of of an ink produced in this manner is much greater than in normal printing methods so that the printed thick materials thus produced can be used as printed electric circuits or name plates.

It has, however, been observed that it was difficult to transfer a sufficient amount of ink from the printing plate to the metal or plastic sheets. This problem in such a printing technology (hereinafter called "thick printing") seems to originate from a poor ink-absorbability of the metal or plastic sheets and also from a high viscosity of the ink used therein, the high viscosity being necessary to avoid an undesirable lateral expansion of the ink on said sheets.

To solve the above problem, it has been proposed to reduce a rotational speed of the printing plate to a range of 200 to 300 mm/sec. This speed in the thick printing is equal to about one tenth of that in the ordinary printing. A clear and vivid image will be produced on the metal or plastic sheets owing to sufficient deposit of ink thereon, if the following difficulty were not encountered.

The difficulty with a reduced speed of the printing plate is that it results in an excessive amount of ink transferred from the inking rollers to said printing plate. This superfluous transfer of ink is most disadvantageous in the case where neither dampening water nor a doctor blade is used because the comparatively lower oil-repellency of said silicone laminate brings about a contamination of the non-image area thereby making the printed sheets dirty.

Furthermore, known printing systems have still another disadvantage in terms of economy. In cases where it is necessary to alter the dimensional sizes of the printing plates, the known systems must use plural plate cylinders of various sizes or comprise a single cylinder of an extremely large diameter capable of attaching thereon any large printing plate and any small printing plate. When a small plate is to be attached on the large diameter cylinder having a plate holding device located thereon at a fixed position, the small plate must be enlarged to have a great portion of blank area so that manufacturing cost of such small printing plates, especially intaglio plates, becomes very expensive and uneconomical.

BRIEF SUMMARY OF THE INVENTION

Therefore, it is an object of the invention to eliminate the above-mentioned disadvantages.

In accordance with the invention those disadvantages are avoided by providing an apparatus for lithography or intaglio printing comprising:

a plate cylinder having at least one printing plate mounted thereon which has a length less than half the circumference of the plate cylinder;

an impression cylinder adapted to be pressed against the plate at an engagement point so as to rotate at the same peripheral speed as that of said plate cylinder;

a plurality of inking rollers located adjacent to each other and in contact with the surface of said plate, the distance between the inking rollers and the engagement point being greater than the peripheral length of the printing plate mounted on said plate cylinder; and a speed control device connected to drive the plate cylinder so as to control the rotational speed thereof so that said plate cylinder rotates at a higher speed while the printing plate is in contact with at least one of the inking rollers and said plate cylinder rotates at a lower speed while said printing plate is passing through the engagement point, wherein the speed control device comprises a variable speed motor adapted to cause the plate cylinder to rotate at the higher and lower speeds during each rotation of said plate cylinder.

According to the invention, the conflict or unbalance existing between the process condition in the inking step and that in the subsequent printing step is favorably resolved. In other words, the metal or plastic sheets can now be clearly printed with a greater thickness of ink deposited thereon. The invented apparatus is most suited to the printing process performed without utilizing dampening water or a doctor device which is usually applied to sweep a surface of the printing plate.

Besides, it is no longer necessary to provide a variety of plate cylinders even when printing plates of various sizes are used because the apparatus of the invention can be large enough to carry two printing plates. This will afford a remarkable reduction in the cost of printing a metal or plastic plate with a thick deposit of ink.

Other objects and advantages of the invention will be made clear through the following description of a preferred embodiment.

DETAILED DESCRIPTION OF THE INVENTION

Figure 1:
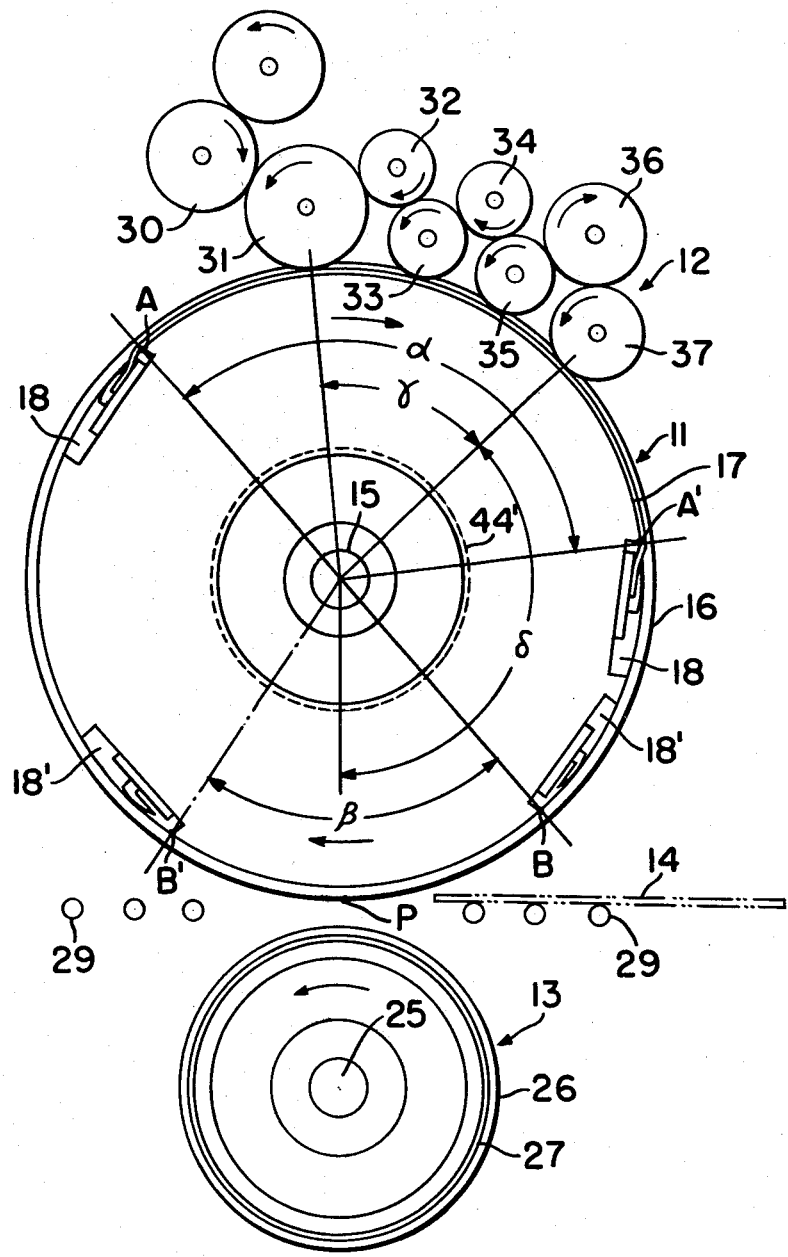
FIG. 1 is a schematic side elevation showing the arrangement of a plate cylinder, a group of inking rollers and an impression cylinder in accordance with one embodiment of the invention.

Referring now to FIG. 1 of the drawing, the numerals 11, 12, 13 and 14 respectively indicate a plate cylinder, a group of inking rollers, an impression cylinder and a sheet material such as a plastic sheet which is to be printed. A shaft 15 is secured to the plate cylinder 11 at both the side webs thereof by means of flanges, only one of them shown, the shaft being journaled in bearings (not shown) so as to rotate around a fixed axis. The plate cylinder has no doctor blade and is adapted to be driven by a drive shaft (not shown) having a drive pinion engaging with a driven spur gear 16, said gear being secured to another flange at the opposite side of said plate cylinder. The numeral 17 indicates an intaglio printing plate which is not dampened with water. The intaglio plate 17 is wound around and secured to a cylindrical surface of the cylinder 11 through a distance corresponding to a center angle $\alpha(\alpha=124°$ in the illustrated embodiment).

Figure 2:
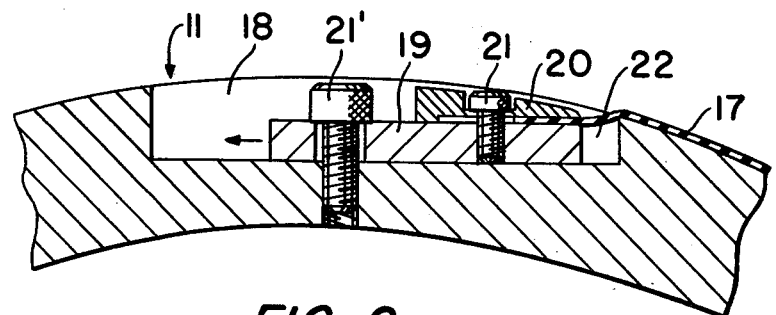
FIG. 2 is a partial sectional view, showing a typical structure for attaching and fixing a printing plate to said plate cylinder in the embodiment of FIG. 1.

The plate 17 is fastened in a manner as shown in FIG. 2. A pair of recesses 18, 18 extend over the full width of the surface of the plate cylinder 11 in parallel with the shaft 15, the distance between said recesses corresponding to the central angle $\alpha$. Seats 19, 19 respectively lie on the bottoms of said recesses and are slidably fastened thereto so as to be movable a short distance in the direction of rotation indicated by the arrow. Each of the end portions of the intaglio plate 17 is clamped between the seat 19 and a clamp 20, the latter being connected to the seat by means of bolts 21.

As will be understood from the foregoing description, the intaglio plate 17 may be fastened to the cylinder in the following manner. Initially, said plate 17 is laid on the cylindrical surface of the plate cylinder 11, and each end of the plate is inserted into a gap between the seat 19 and the clamp 20. The plate 17 is then screwed fast at the end thereof to the seat 19 by means of bolts 21 each having a hexagonal hole in its head. First, one of the seats 19, 19 is fixed to the plate cylinder 11 by bolts 21', 21', and thereafter the other seat 19 is forced to shift a little distance by inserting a wedge (not shown) laterally into a clearance 22 between the tip end of said seat 19 and the wall of the recess 19. Thus, an adequate tension is given to the intaglio printing plate 17. Finally, the bolts 21' are tightened and the wedge is withdrawn.

The arc length of the plate cylinder 11 measured between the two recesses 18, 18 thereof, namely between the points A, A' shown in FIG. 1, will be approximately 540 mm. when the plate cylinder 11 has a comparatively large diameter, for instance 500 mm. Accordingly, the plate cylinder will be able to receive thereon a large size intaglio plate having a length of 500 mm. measured in the longitudinal direction. The outer surface defined between the points A, A' will be hereinafter called "surface (AA')". The numerals 31, 33, 35 and 37 indicate inking rollers, each of which is coated with a rubber lining, whereas the numerals 30, 32, 34 and 36 indicate intermediate metal rollers included in the group 12. The plate cylinder 11 drives, by frictional force, the inking rollers, which are in contact with the plate cylinder's surface over the range corresponding to a central angle $\alpha$, that range corresponding to the portion to which the intaglio plate is attached. An ink feeder (not shown) supplies ink to the intermediate roller 30 which transfers the ink to the inking roller 31 and to the other inking rollers by means of the other intermediate rollers interposed therebetween.

The above-mentioned impression cylinder 13 has bosses integrally formed on its side webs. Each of these bosses is secured to an outer race of a ball-and-roller bearing, each end of a shaft 25 being secured to an inner race of said bearing. Therefore, the shaft 25, which freely rotatably supports the impression cylinder 13, does not rotate itself whereas the shaft 15 of the plate cylinder rotates. The shaft 25 has a neck-shaped end portion at each end so as to be supported by an enlarged end portion of a lever provided in a reciprocation mechanism (not shown). Thus the impression cylinder 13 reciprocates in the vertical direction as shown in FIG. 1, toward and away from the plate cylinder, the impression cylinder being shown in its lower position in FIG. 1. The impression cylinder 13 has a driven spur gear 26 secured to the web on the opposite side as viewed in FIG. 1. A drive shaft carries a drive pinion (not shown) which engages the spur gear 26 so as to rotate the impression cylinder.

The numeral 27 indicates a blanket which is attached to the outer surface of the impression cylinder 13. In this embodiment, the outer diameter of the cylinder 13 carrying the blanket 27 is one half of that of the plate cylinder 11 carrying the printing plates. The gear ratios of gear trains for driving said two cylinders 11, and 13 respectively, are such that the impression cylinder 13 rotates twice for each rotation of the plate cylinder 11. A variable speed motor (for example, a direct current motor whose speed is controlled by means of a voltage regulating system) may be used to drive both the cylinders 11 and 13.

Because of the above-mentioned drive mechanism, no slippage will occur in printing operation either between the surface of the printing plate 17 and the printed sheet material 14 or between the material and the blanket 27 mounted on the impression cylinder 13. The numeral 29 indicates feed rollers which supply the material 14 to the apparatus.

Figure 3:
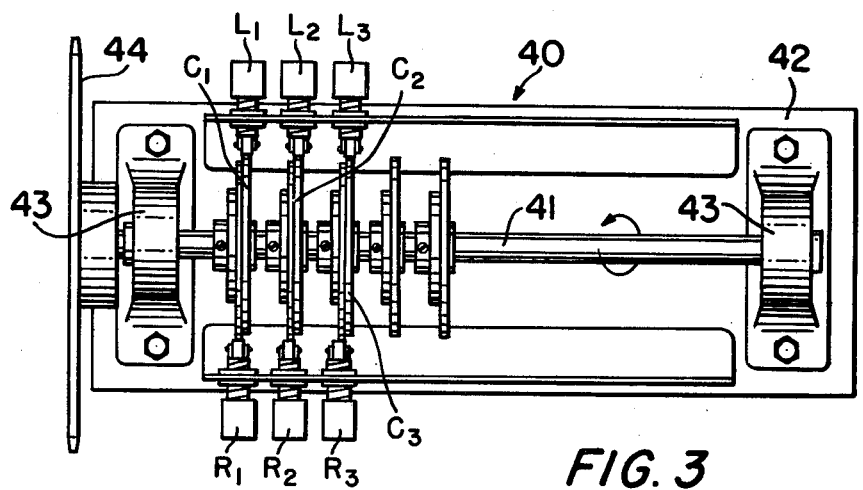
FIG. 3 is a plan view of a device for controlling the rotation of said plate cylinder as well as for controlling the reciprocating motion of said impression cylinder.
Figure 4:
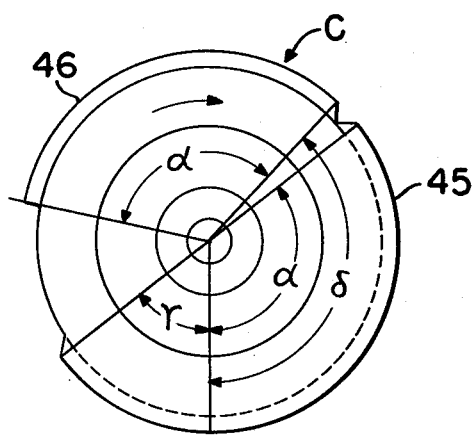
FIG. 4 is a front elevation view showing an example of a cam member incorporated in the device of FIG. 3.

As shown in FIG. 3, bearings 43, 43 disposed on a bed 42 rotatably support a cam shaft 41 having a sprocket wheel 44 fixed at one end. The shaft 15 of the plate cylinder 11 also has a sprocket wheel 44' which has the same number and pitch of teeth as the sprocket wheel 44 has, and is operatively connected thereto by an endless chain (not shown) extended therebetween. A series of cam plates $C_1$, $C_2$, $C_3$, etc., each having two peripheral surfaces of different shape as shown in FIG. 4 for performing different controls, are fixed to the common shaft 41 so as to rotate therewith. Two series of microswitches $R_1$, $R_2$, $R_3$, etc. . . . and $L_1$, $L_2$, $L_3$, etc. . . . , each having a contact roller, are closed or opened by the corresponding cam plates in various ON-OFF modes to control the operation of the apparatus.

In operation, with a very viscous ink having a viscosity of, for instance, about 1,000 poise, a large scaled intaglio plate 17 is set on the surface (AA'), and materials 14 such as plastic sheets are fed by the feed rollers 29 into the apparatus one after another to be printed by said intaglio plate without aid of dampening water. Prior to a regular printing run, a proofing test is done in order to ascertain that a printing step at a speed, for instance, of 260 mm./sec. of the intaglio plate end and an inking step at a faster speed, for instance, of 520 mm./sec., will give a satisfactory result. The criteria for judging the performance are, on the one hand, no occurrences of noticeable staining of the non-image area in plate 17 in the inking step and, on the other hand, a satisfactory thick printing of the material 14 in the printing step. The latter criterion relates to another requirement, that the ink should be sufficiently transferred onto the image area of said plate 17 during said inking step.

After the test run, the speed of the variable speed motor is set by means of a control panel (not shown) such that both the two cylinders will rotate at a rotational speed of 390 mm./sec., namely at a median speed intermediate the aforementioned inking and printing speeds.

Meanwhile, the control devices and related circuits are arranged such that when the microswitch $R_1$ is closed, it reduces the electric resistance of the magnet coils of said motor, thereby accelerating the speed thereof until a predetermined inking speed (e.g. 520 mm./sec.) is obtained, and this speed is maintained until the switch $R_1$ is opened. The control devices and related circuits cause the system to operate in such a manner that when the microswitch $L_1$ is closed, it increases said resistance so as to decelerate the motor speed and thus speeds of both the cylinders to the printing speed (e.g. 260 mm./sec.), which has been preset at the control panel and will be maintained so long as the switch $L_1$ is closed.

The group 12 of inking rollers shown in FIG. 1 are located around the surface of the plate cylinder 11, within the angular range $\gamma$. The plate cylinder rotates, however, $\alpha$ degrees of angle during the "inking step". Likewise, the cylinder 11 rotates also $\alpha$ degrees of angle during the "printing step" because the material 14 is pressed against the intaglio plate 17 by the impression cylinder 13 within the same angular range.

On the other hand, the angular speeds of the cam plate $C_1$ and of the plate cylinder 11 are always the same because the number and pitch of teeth of the sprocket wheels 44, 44' are the same.

Accordingly, as shown in FIG. 4, the cam plate $C_1$ is shaped to provide a peripheral zone 45 on one surface for closing the switch $R_1$ and a peripheral zone 46 on the other surface for closing the switch $L_1$. Both zones 45 and 46 have the same center angle $\alpha$, and the phase difference between said two zones 45, 46 is consistent with an angle $\delta$ shown in FIG. 1 as defining the angle between the inking and the printing positions of the plate cylinder with respect to its axis rotation.

As pointed out previously, the two zones 45 and 46 of the cam $C_1$ are on different peripheral surfaces and do not interfere with each other. In other words, the zone 45 operates only the switch $R_1$ while the zone 45 operates only the switch $L_1$. Therefore, the cam $C_1$ desirably comprises two plane members integrally connected in a face to face relation such that the zones 45, 46 are angularly spaced from one another by the angle $\delta$. Correspondingly, the switches $R_1$, $L_1$ are laterally offset slightly in the direction of the shaft 41.

The cam $C_2$ controls a small-scale intaglio printing plate fixed on the surface (BB'). The peripheral shape of the cam $C_2$ is similar to that of the cam $C_1$.

When the large size plate is used, one of the push button switches on the control panel is turned on for selection of the surface (AA'), thereby connecting the signal circuits of switches $R_1$ and $L_1$ to the control circuit and starting the variable speed direct current motor. The plate cylinder 11 and the impression cylinder 13 respectively initially rotate in the directions of the arrows (FIG. 1) at the aforementioned rotational speed, for instance 390 mm./sec. When the printing plate 17 approaches the inking roller 31, the switch $R_1$ is closed by the peripheral zone 45 of the cam $C_1$ rotating at the same angular speed as that of the cylinder 11. The thus activated circuits will then accelerate the speed of said motor so as to impart to both the cylinders 11 and 13 a predetermined higher rotational speed, for instance 520 mm./sec. This speed is maintained so long as the zone 45 is in contact with the switch $R_1$. Under this condition the group 12 of inking rollers will supply the printing ink to the image area of the intaglio plate 17, the non-image area thereof not being inked at all.

In the meantime, the material 14 such as a plastic sheet will be fed into the apparatus and held at a position where its forward end is approximately 5 mm. before the printing point P. When the forward end (viewed in the direction of rotation) of the intaglio plate 17 has reached said printing point P, the microswitch $R_3$ will be turned on by the cam $C_3$ so that the reciprocating mechanism is activated. Thus, the impression cylinder 13 will be moved toward the plate cylinder to impart a printing pressure to the intaglio plate 17 through the material 14 whereby the printing step begins.

Before the printing step starts, the other peripheral zone 46 of the cam $C_1$ closes the other switch $L_1$ to decelerate the rotational speeds of both the cylinders 11 and 13 to 260 mm./sec. During the printing step, said zone 46 continues to be in contact with said switch $L_1$, and said lower speed is maintained to transfer a sufficient amount of ink from the image area of the plate 17 onto the material 14.

When the rearward end of said printed sheet has arrived at a point beyond the printing point P by approximately 5 mm., the microswitch $L_3$ is closed by the other peripheral surface of the cam $C_3$. As a result, said reciprocating mechanism will operate in reverse direction to separate the impression cylinder 13 from the plate cylinder so as to release the printing pressure which has been applied to the printing plate 17. The printed material 14 is then discharged by the feed rollers 29 for the next process. At the same time the peripheral zone 46 leaves the switch $L_1$, and consequently the two cylinders 11 and 13 begin to rotate at the standard speed, i.e. 390 mm./sec. This speed will be maintained until the zone 45 of the cam $C_1$ reaches the switch $R_1$ again. The inking and the printing steps will be repeated for the desired times in the above-described manner.

If desired, lithography or intaglio plates of different sizes may be used. In this case the peripheral surface of the plate cylinder is divided into two or more portions positioned so that any printing plate can be attached thereto. In addition, the reciprocation of the impression cylinder and the transporting motion of the feed rollers are arranged to occur at the proper times according to the plate size. For example, the plate cylinder 11 includes an additional pair of recesses 18', 18' on its surface as shown in FIGS. 1 and 3. The angle between those recesses is $\beta(\beta=75°$ in the illustrated embodiment), and the peripheral length between the points B, B', i.e. the recesses 18', 18', is nearly 320 mm. This is long enough to attach small sized printing plates from 280 to 200 mm. long. These smaller plates may be set and fixed on the surface (BB') and then the control panel (not shown) may be operated so as to choose the cam $C_2$ for the microswitches $R_2$, $L_2$ and to activate their signal circuits.

If the center angle $\beta$ is about 55°, the peripheral length of plate cylinder surface defined between the points B, B' will be 240 mm., which is enough for a much smaller printing plate of 200 mm. length.

Although the illustrated plate cylinder is adapted to receive and fix one or two intaglio plates on its partial surfaces (AA') and/or (BB'), it can be modified so as to be suitable for lithography plates, or to have more than two partial surfaces for any kind of plates having the same or different sizes.

To summarize, each of the inking and printing actions of the apparatus described herein is performed at different speed during one rotation of the plate cylinder. The inking speed can be twice the printing speed or more. For printing metal or plastic sheets, the inking speed may be high, e.g. 500 mm./sec., and the printing speed may be low, e.g. about 200 to 300 mm./sec. The apparatus of the invention makes it possible to adopt the above conditions for excellent printing with thick deposits of ink using an ink whose viscosity is e.g. 1,000 poise. Despite the elimination of water dampening, scumming can be avoided. The invention also permits the plate cylinder to be adjusted in accordance with a change in the plate size, that is, the cylinder need not be replaced even when the plate size is changed. Any unused non-image area larger than the image area no longer need be included into the printing plate. Thus, the use of the expensive plate material may easily be reduced to the minimum necessary.

I claim:

1. An apparatus for lithography or intaglio printing comprising:
    a plate cylinder having at least one printing plate mounted thereon which has a length less than half the circumference of the plate cylinder;
    an impression cylinder pressed against the plate at an engagement point when said plate is adjacent said impression cylinder, means rotating said impression cylinder at the same speed as said plate cylinder is rotating when said plate is passing through said engagement point;
    a plurality of inking rollers located adjacent to each other and contacting said plate as said plate is carried past said inking rollers by said plate cylinder, the distance between the inking rollers and the engagement point being greater than the peripheral length of the printing plate mounted on said plate cylinder; and
    speed control means connected to drive the plate cylinder so as to control the rotational speed thereof so that said plate cylinder rotates at a higher speed while the printing plate is in contact with at least one of the inking rollers and at a lower speed while said printing plate is passing through the engagement point.

2. An apparatus as set forth in claim 1 wherein the speed control means comprises a variable speed motor adapted to cause the plate cylinder to rotate at the higher and lower speeds during each rotation of said plate cylinder.

3. An apparatus as set forth in claim 2 wherein the plate cylinder is adapted to carry thereon at least two printing plates each of which is shorter than half of the circumference of said plate cylinder.

* * * * *